US010727120B2

(12) United States Patent
Lin et al.

(10) Patent No.: US 10,727,120 B2
(45) Date of Patent: Jul. 28, 2020

(54) CONTROLLING BACK-END-OF-LINE DIMENSIONS OF SEMICONDUCTOR DEVICES

(71) Applicant: GLOBALFOUNDRIES INC., Grand Cayman (KY)

(72) Inventors: Sean X Lin, Watervliet, NY (US); Ruilong Xie, Niskayuna, NY (US); Guoxiang Ning, Clifton Park, NY (US); Lei Sun, Altamont, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/111,193

(22) Filed: Aug. 23, 2018

(65) Prior Publication Data

US 2020/0066586 A1   Feb. 27, 2020

(51) Int. Cl.
*H01L 23/48*   (2006.01)
*H01L 21/768*  (2006.01)
*H01L 23/522*  (2006.01)
*H01L 23/528*  (2006.01)
*H01L 23/58*   (2006.01)

(52) U.S. Cl.
CPC .. *H01L 21/76885* (2013.01); *H01L 21/76804* (2013.01); *H01L 21/76816* (2013.01); *H01L 21/76834* (2013.01); *H01L 21/76871* (2013.01); *H01L 21/76879* (2013.01); *H01L 23/5226* (2013.01); *H01L 23/5283* (2013.01); *H01L 23/585* (2013.01)

(58) Field of Classification Search
CPC .............. H01L 23/5226; H01L 23/585; H01L 23/5283; H01L 21/76871; H01L 21/76879; H01L 21/76885
USPC .................................. 257/758, 774
See application file for complete search history.

(56) References Cited

U.S. PATENT DOCUMENTS

| | | | | | |
|---|---|---|---|---|---|
| 5,200,808 | A | * | 4/1993 | Koyama | H01L 21/76804 257/750 |
| 5,308,793 | A | * | 5/1994 | Taguchi | H01L 21/28518 257/E21.584 |
| 5,572,072 | A | * | 11/1996 | Lee | H01L 21/76838 257/751 |
| 6,002,175 | A | * | 12/1999 | Maekawa | H01L 21/76804 257/760 |
| 6,577,013 | B1 | * | 6/2003 | Glenn | H01L 23/3114 257/618 |
| 7,915,736 | B2 | * | 3/2011 | Kirby | H01L 21/76868 257/774 |
| 8,865,555 | B2 | * | 10/2014 | Yamazaki | H01L 29/66742 438/296 |
| 8,975,531 | B2 | * | 3/2015 | Anderson | H01L 21/76847 174/255 |

(Continued)

*Primary Examiner* — Nitin Parekh
(74) *Attorney, Agent, or Firm* — David Cain

(57) ABSTRACT

A method of fabricating interconnects in a semiconductor device is provided, which includes forming a metallization layer and depositing a hardmask layer over the metallization layer. A dielectric layer is deposited over the hardmask layer and an opening is formed in the dielectric layer to expose the hardmask layer. The exposed hardmask layer in the opening is etched to form an undercut beneath the dielectric layer. A metal shoulder is formed at the undercut, wherein the metal shoulder defines an aperture dimension used for forming a via opening extending to the metallization layer.

14 Claims, 10 Drawing Sheets

(56) References Cited

U.S. PATENT DOCUMENTS

| | | | |
|---|---|---|---|
| 8,994,181 B2* | 3/2015 | Chen | H01L 23/291 |
| | | | 257/774 |
| 9,346,669 B2* | 5/2016 | Howard | B81C 1/00095 |
| 9,558,999 B2* | 1/2017 | Li | H01L 21/76846 |
| 9,607,881 B2* | 3/2017 | Liu | H01L 21/764 |
| 9,741,609 B1 | 8/2017 | Cheng et al. | |
| 2006/0006552 A1* | 1/2006 | Kang | H01L 24/03 |
| | | | 257/786 |
| 2006/0148250 A1* | 7/2006 | Kirby | H01L 21/76898 |
| | | | 438/667 |
| 2011/0274829 A1* | 11/2011 | Feurer | H01L 21/4857 |
| | | | 427/97.6 |
| 2013/0109158 A1 | 5/2013 | Lee et al. | |
| 2015/0001735 A1 | 1/2015 | Mignot et al. | |
| 2015/0092381 A1* | 4/2015 | Zhang | H05K 3/423 |
| | | | 361/783 |

* cited by examiner

CONTROLLING BACK-END-OF-LINE DIMENSIONS OF SEMICONDUCTOR DEVICES

FIELD OF THE INVENTION

The presently disclosed subject matter relates generally to the fabrication of semiconductor devices, and more particularly to a method of controlling dimensions of back-end-of-line (BEOL) structures and the resulting device.

BACKGROUND

The ongoing progress in the semiconductor industry is continuing to lead to greater device miniaturization. Device miniaturization is enabled by increasing structure pattern density and enhancing functionality that effectively reduces the cost per chip. As the geometric limits of the semiconductor structures are pushed against process technology limits, the dimensions of the structures formed in an integrated circuit have shrunk to the point where tighter tolerances and precise process controls are critical to further device miniaturization and fabrication success.

However, with smaller geometries, precise dimension control has become increasingly difficult. For interconnect via fabrication, many processes are inadequate to produce the needed smaller geometries and the required structural integrity. It is undesirable to have tapered profiles forming at the top and/or sidewalls of the interconnect vias, as such profiles may cause undesirable deviation from electrical property design specifications and thereby compromise the quality and reliability of the semiconductor device. The conventional approach to reduce the dimensions of semiconductor devices is to rely on improvements to the lithographic process. Such improvements can be time consuming and expensive, often requiring additional process steps and/or expensive new equipment.

It is, therefore, desirable to provide a method that has improved process control for fabricating structures with smaller dimensions, in particular, back-end-of-line interconnects.

SUMMARY

To achieve the foregoing and other aspects of the present disclosure, a method of controlling the dimensions of back-end-of-line structures and the resulting device are disclosed.

According to an aspect of the present disclosure, a method of fabricating interconnects in a semiconductor device is provided, which includes forming a metallization layer and depositing a hardmask layer over the metallization layer. A dielectric layer is deposited over the hardmask layer and an opening is formed in the dielectric layer to expose the hardmask layer. The exposed hardmask layer in the opening is etched to form an undercut beneath the dielectric layer. A metal shoulder is formed at the undercut, wherein the metal shoulder defines an aperture dimension used for forming a via opening extending to the metallization layer.

According to another aspect of the present disclosure, a semiconductor device with an interconnect structure is provided. The interconnect structure includes a metallization layer having at least one metal line, a dielectric layer, a metal ring and a via opening. The dielectric layer is formed on the metallization layer. The metal ring is formed on the dielectric layer. The via opening is formed in the dielectric layer, wherein the via opening has a top opening with the metal ring located at a shoulder portion thereof and a bottom opening that is aligned to the metal line.

BRIEF DESCRIPTION OF THE DRAWINGS

The embodiments of the present disclosure will be better understood from a reading of the following detailed description, taken in conjunction with the accompanying drawings.

Figure 1:
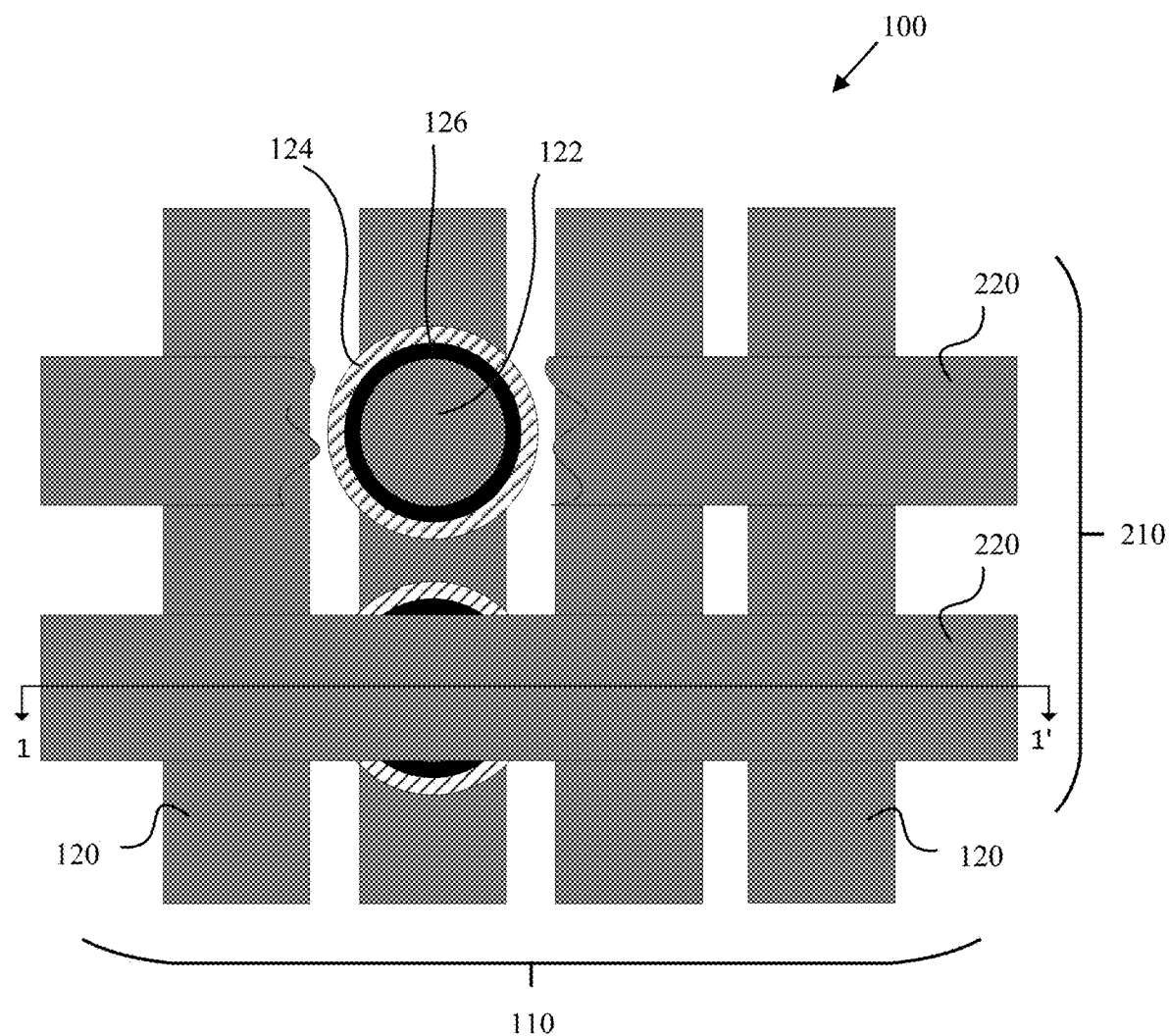
FIG. 1 is a top view of a semiconductor device according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the device or the application and uses of the device. Furthermore, there is no intention to be bound by any theory presented in the preceding background of the device or the following detailed description.

A method and a structure are disclosed for fabricating a back-end-of-line (BEOL) interconnect structure and controlling a top dimension of a via opening in a semiconductor device. The control of the top dimension is accomplished by growing a metal shoulder at a top portion of the via opening. The metal shoulder provides a controllable aperture dimension for forming the via opening. This method in the present disclosure provides an attractive solution for controlling the top dimension of the via opening, which overcomes the limitations of the conventional lithography and/or etch processes to reliably fabricate features of small geometries.

FIG. 1 is top view of a semiconductor device 100, in accordance with embodiments of the present disclosure. More specifically, with reference to FIG. 1, the semiconductor device 100 includes a first metallization layer 110 (i.e., a first array of metal lines 120 interposed by dielectric material) at a first level, interconnect vias 122 with a metal ring at a top portion connecting to a second metallization layer 210 (i.e., a second array of metal lines 220 interposed by dielectric material) at a second level. The metal ring includes an outer ring of a seeding material 124 and an inner ring of a metal shoulder 126. In this embodiment, the second metallization layer 210 is formed perpendicular to the first metallization layer 110. The interconnect vias 122 connect the first metallization layer 110 to the second metallization layer 210, and they are collectively referred to as "interconnects".

The interconnect structure is made of a conductive material and the conductive material is preferably copper (Cu) in advanced interconnect structures, but alternatively, may be cobalt (Co) or other similar conductive materials. A diffusion barrier liner (not shown) may be used to line the interconnects, and such liners are typically made up of tantalum (Ta), titanium (Ti), tungsten (W) or nitrides of these metals. It should be understood that the number and placements of the interconnect vias may vary according to the specific design of each semiconductor device.

FIGS. 2A-2I are cross-sectional views taken along line 1-1' as indicated in FIG. 1 of a semiconductor device 100, in accordance with embodiments of the present disclosure. FIGS. 2A-2I illustrate the present method of controlling a top dimension of a via opening by a growing metal shoulder at a top portion of the via opening.

Figure 2A:
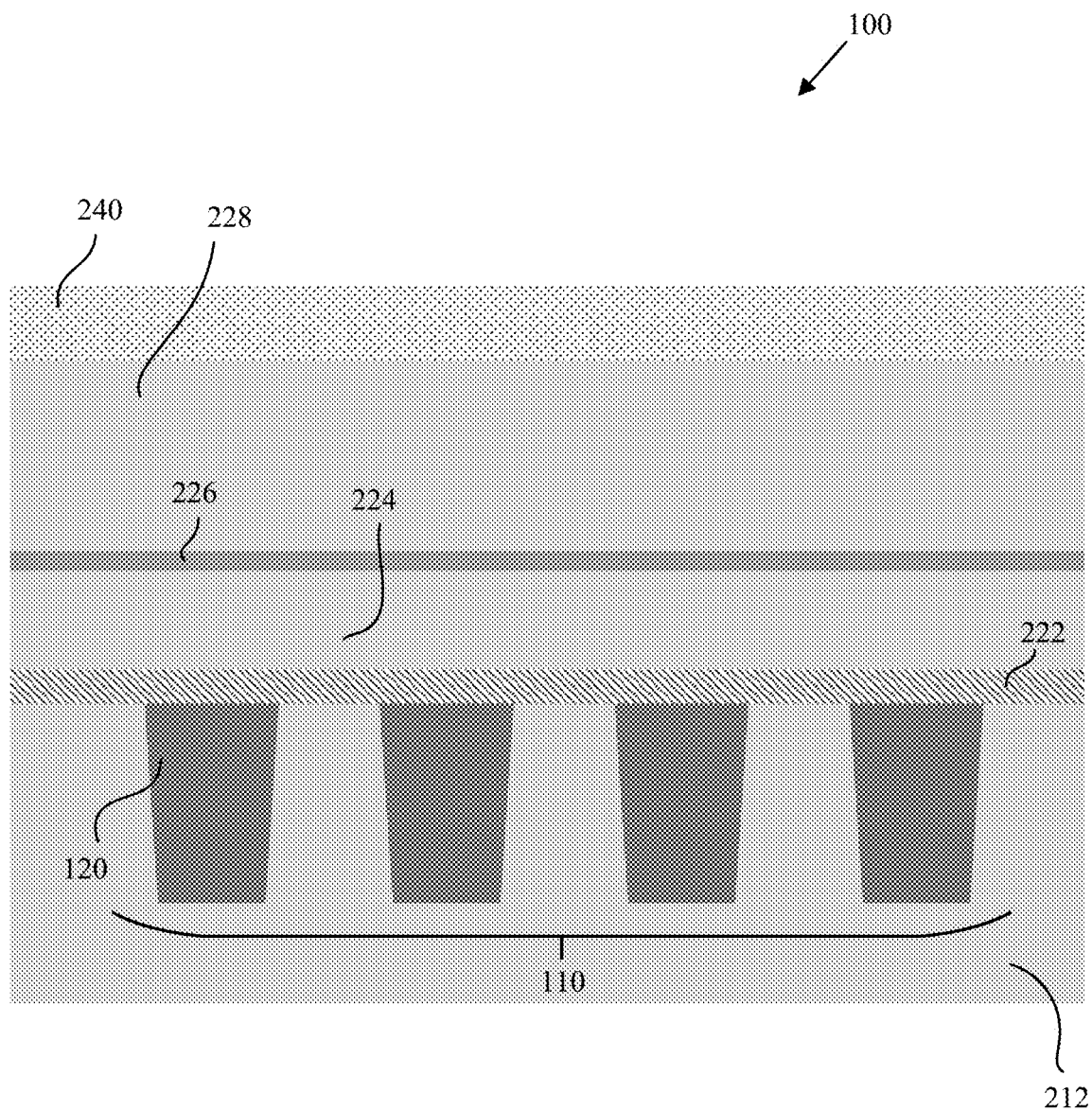
FIG. 2A-2I are cross-sectional views (taken along line 1-1' as indicated in FIG. 1) depicting the formation of an interconnect structure, including an interconnect via in a semiconductor device according to embodiments of the disclosure.

FIG. 2A is a cross-sectional view of an embodiment of the semiconductor device 100 with the metal lines 120 formed in a first dielectric layer 212. A second dielectric layer 222, a third dielectric layer 224, a first hardmask layer 226, a fourth dielectric layer 228 and a second hardmask layer 240 are sequentially deposited on the first dielectric layer 212 and on the metal lines 120.

The second dielectric layer 222, the third dielectric layer 224, the first hardmask layer 226, the fourth dielectric layer 228 and the second hardmask layer 240 may be deposited using conventional deposition processes, including physical vapor deposition (PVD), chemical vapor deposition (CVD), pulsed CVD, plasma-enhanced CVD (PECVD), atomic layer deposition (ALD), plasma-enhanced ALD (PEALD) or combined methods. In one embodiment of the device, the first dielectric layer 212, the third dielectric layer 224 and the fourth dielectric layer 228 compose of similar low-k or ultra-low-k dielectric material and their thicknesses may vary according to the specific design of the semiconductor device. The second dielectric layer 222 is a capping layer, for example, a nitrogen-doped barrier low-k (NBLOK) layer or a nitrogen-doped silicon carbide (NDC) layer. Alternatively, the second dielectric layer 222 can have a selective Co cap over the metal lines 120, followed by the capping layer. The capping layer has a preferable thickness of about 20 nm. The capping layer is able to protect the metal lines 120 so that the conductive material is not exposed to the above dielectric layer. The first hardmask layer 226 is preferably an aluminum oxide ($AlO_x$) layer with a thickness ranging from 2 to 10 nm. The second hardmask layer 240 is preferably a titanium nitride (TiN) layer with a thickness of about 30 nm.

Figure 2B:
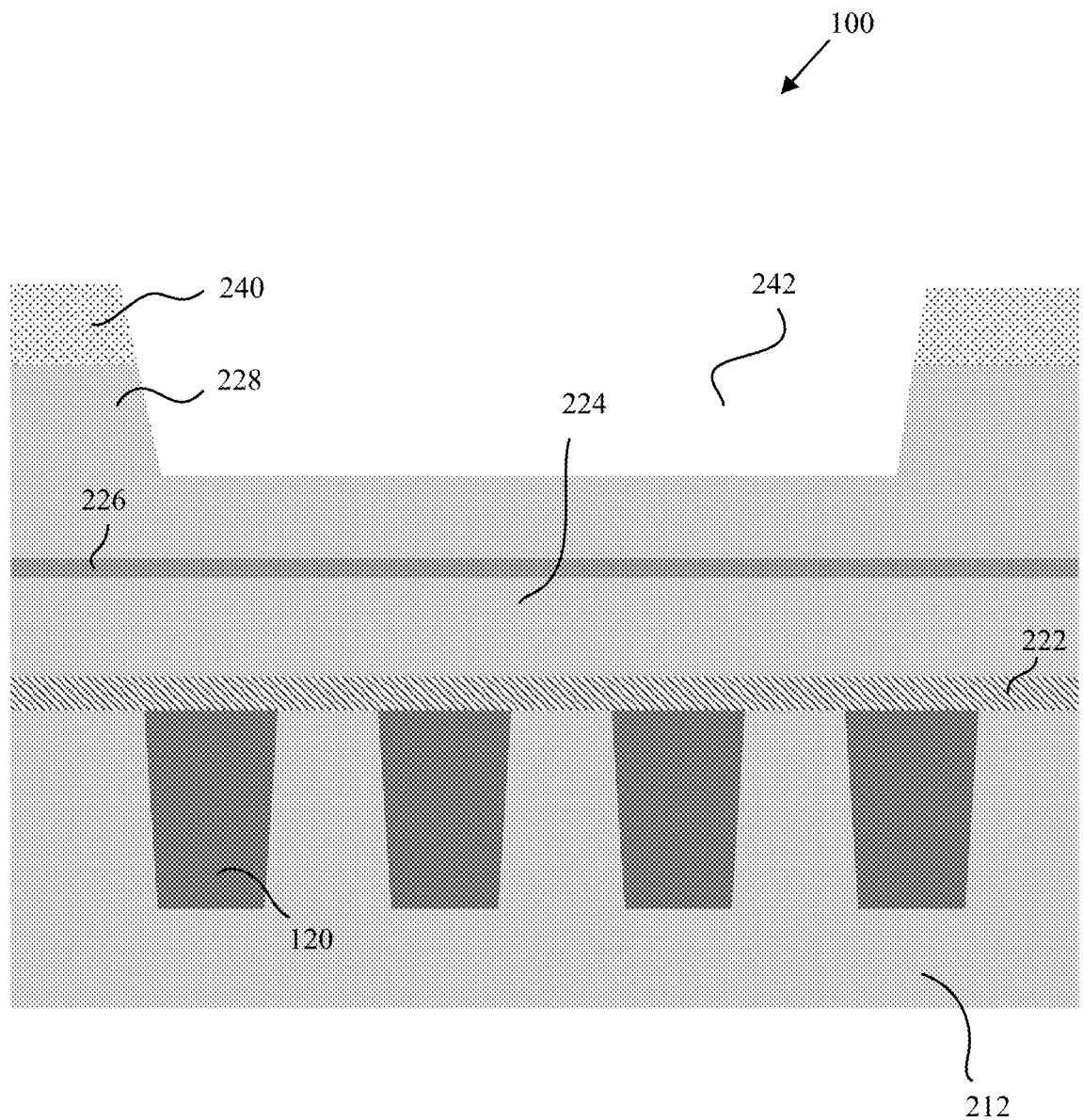

FIG. 2B illustrates the semiconductor device 100 after forming a trench 242 in the fourth dielectric layer 228. After patterning the second hardmask layer 240, the trench 242 is etched in the fourth dielectric layer 228, leaving a portion of the fourth dielectric layer 228 remaining on the first hardmask layer 226.

Figure 2C:
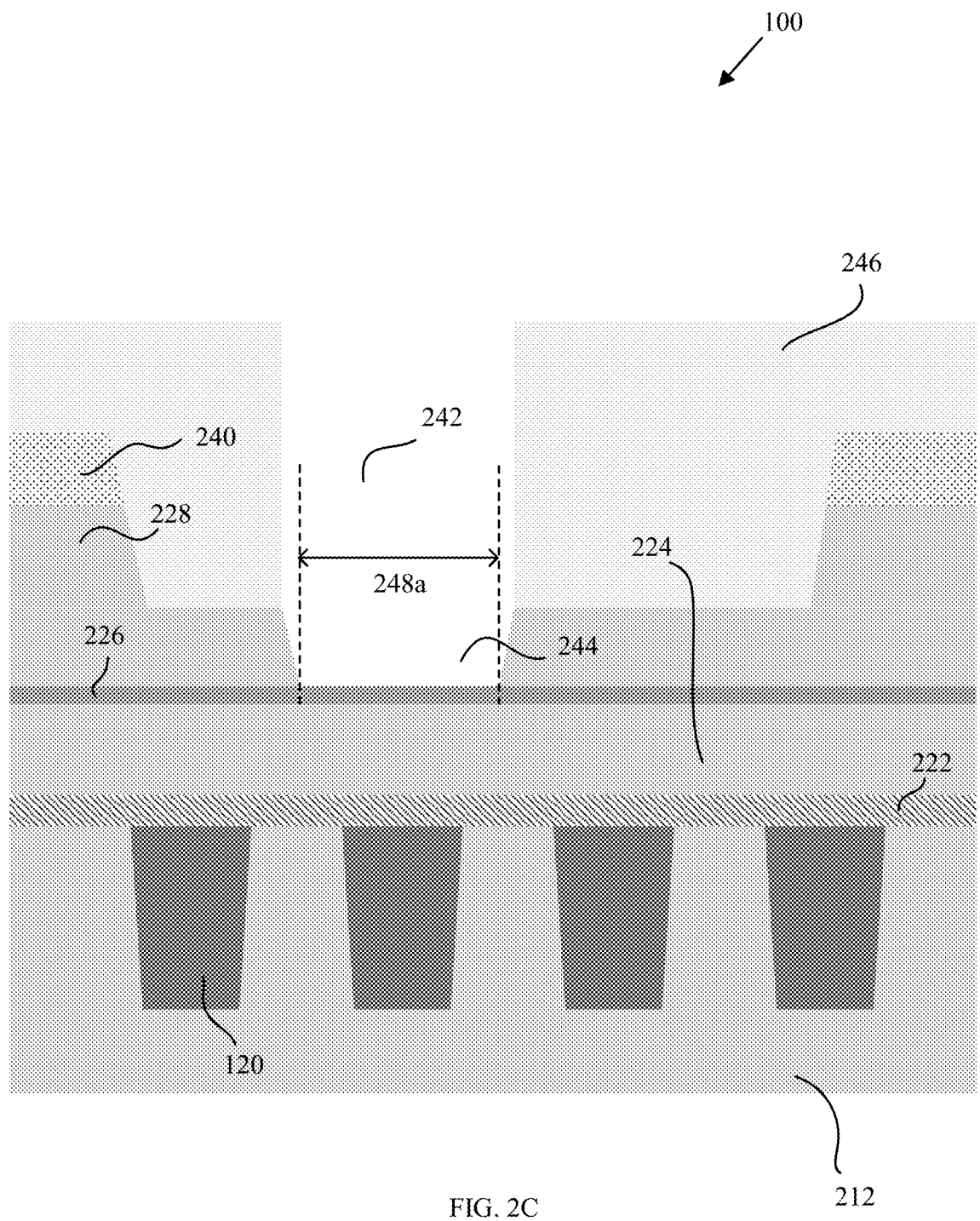

FIG. 2C illustrates the semiconductor device 100 after forming an opening 244 in the trench 242. A layer of optical planarization layer (OPL) 246 is deposited over the second hardmask layer 240 and over the trench 242. The OPL 246 is patterned and the opening 244 is formed in the remaining portion of the fourth dielectric layer 228 to be aligned over the metal line 120 in the first metallization layer 110. The opening 244 exposes a portion of the first hardmask layer 226. The opening dimension is showed as 248a.

Figure 2D:
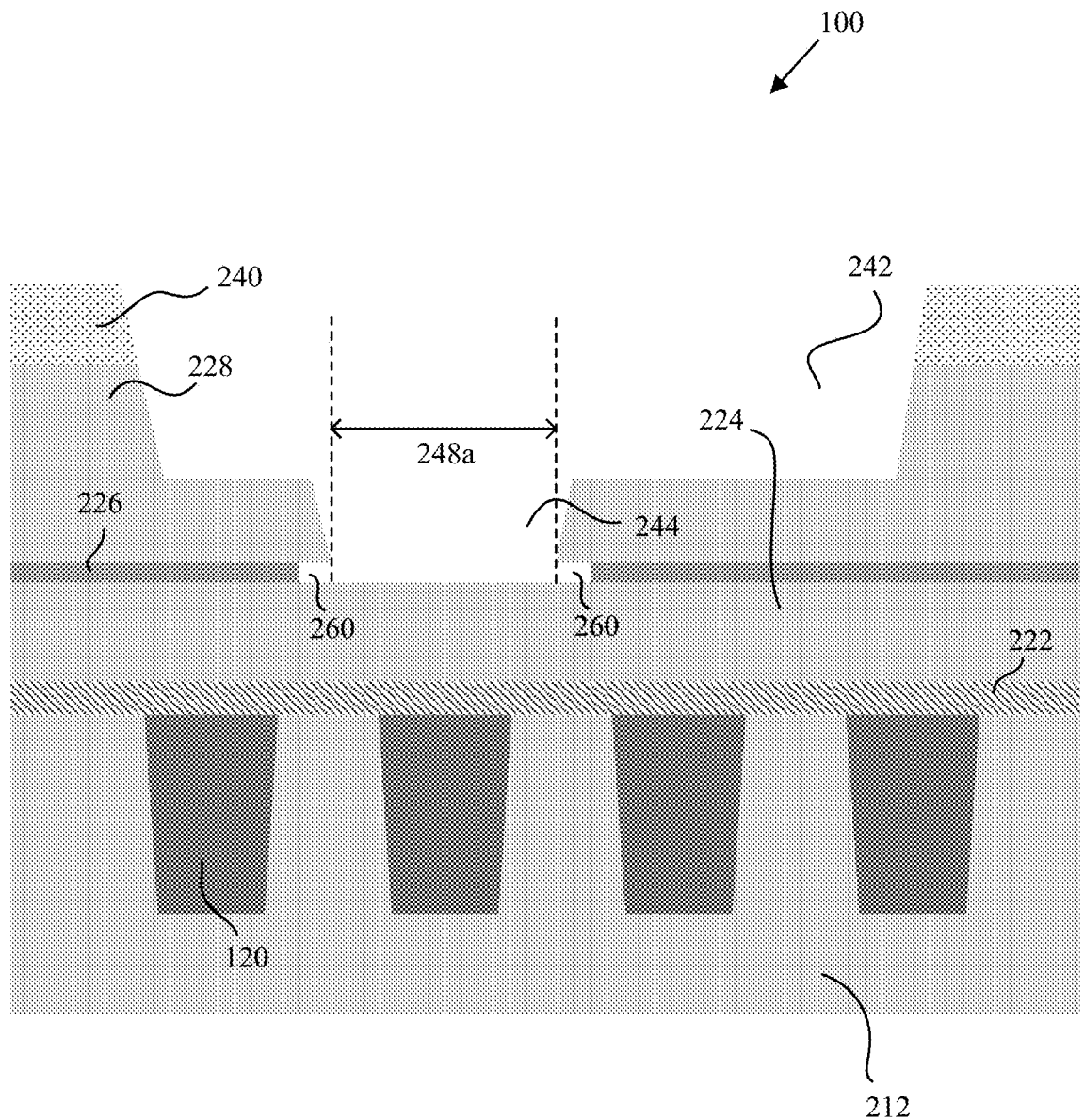

FIG. 2D illustrates the semiconductor device 100 after forming undercuts 260 beneath the fourth dielectric layer 228. The exposed portion of the first hardmask layer 226 are removed by an isotropic etch process that has high selectivity to the first hardmask layer 226. In one embodiment of the device, the width of the undercuts 260 formed beneath the fourth dielectric layer 228 is preferably in the range of 2 to 20 nm.

Figure 2E:
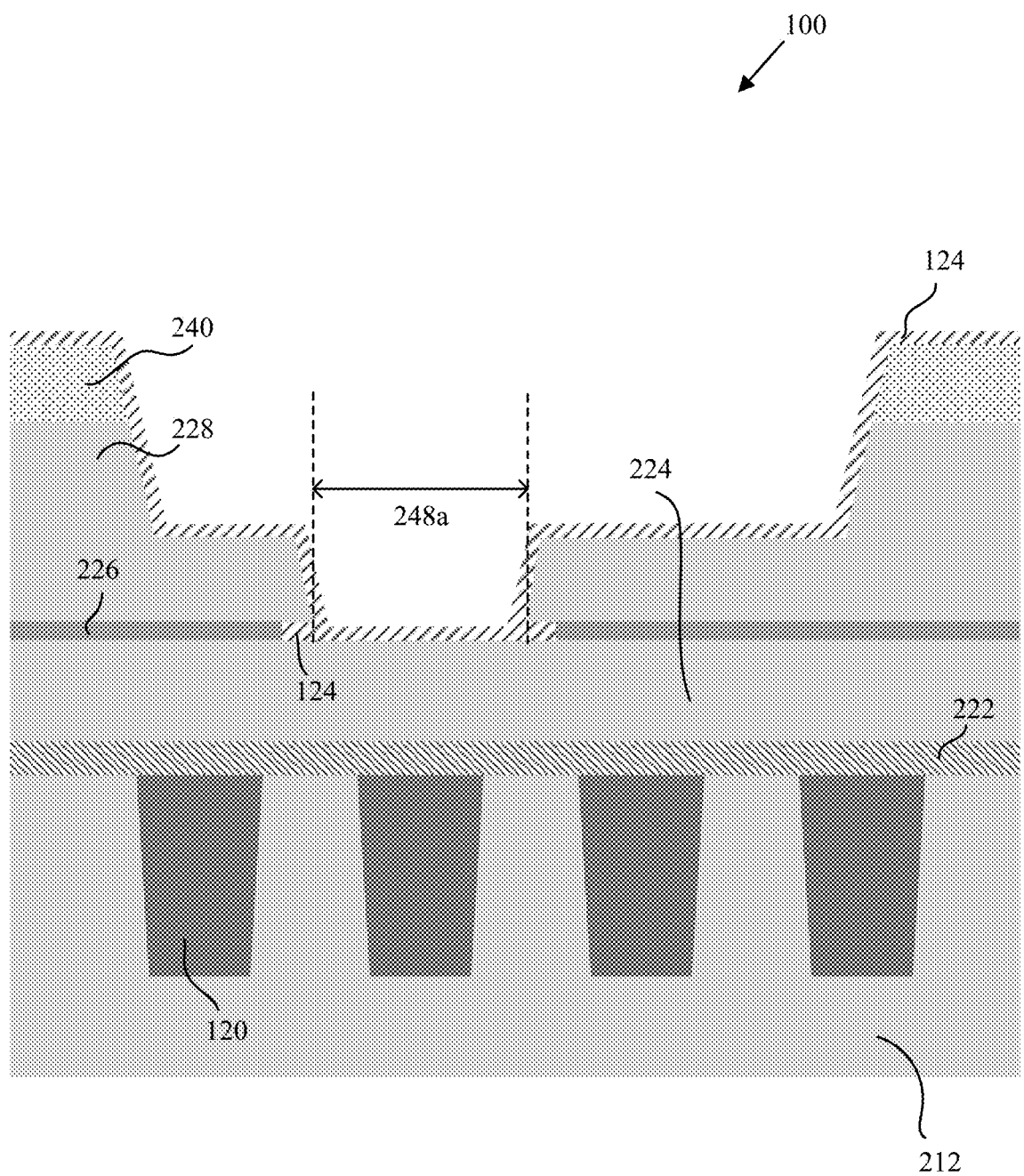

FIG. 2E illustrates the semiconductor device 100 after deposition of a layer of seeding material 124. The seeding material 124 is deposited using an atomic layer deposition (ALD) process, or other suitable deposition processes, and it covers all surfaces, including filling the undercuts 260 beneath the fourth dielectric layer 228. The ALD process provides a highly controlled method to produce a very thin, conformal film to an atomically specified thickness. In one embodiment of the device, the seeding material 124 is preferably a titanium nitride (TiN) layer.

Figure 2F:
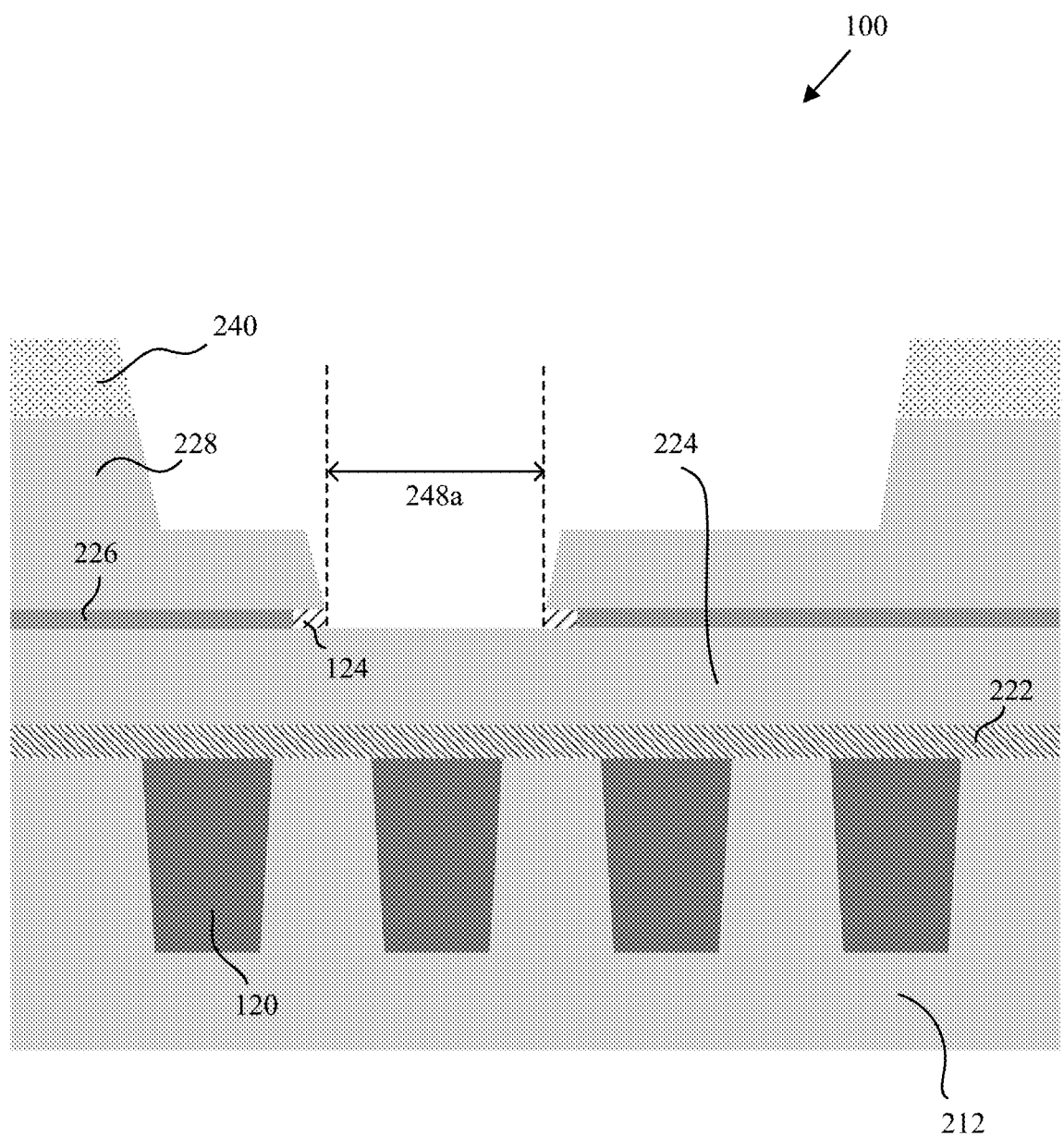

FIG. 2F illustrates the semiconductor device 100 after removing portions of the seeding material 124. The seeding material 124 is removed by an isotropic etch process, exposing a surface of the seeding material 124. The remaining seeding material 124 forms a ring of seeding material near to a top portion of a via opening.

Figure 2G:
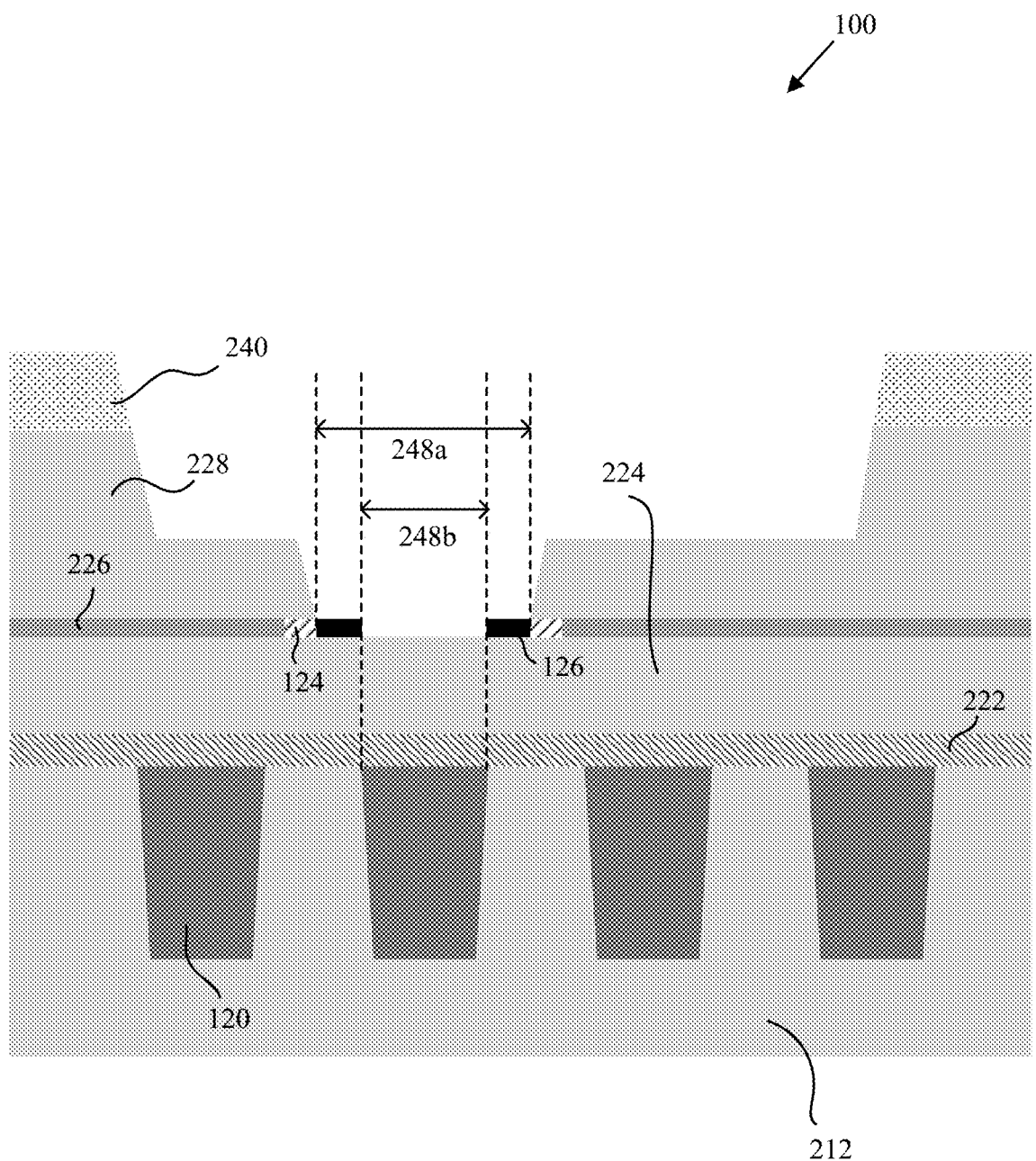

FIG. 2G illustrates the semiconductor device 100 after selectively growing a metal shoulder 126 at the exposed surface of the seeding material 124. The selective metal deposition process can be performed by an ALD process, a CVD process, or other suitable deposition processes. The grown metal shoulder 126 forms an inner ring on the the seeding material 124 and has an aperture dimension 248b. The grown metal shoulder 126 acts like a hardmask layer when forming a via opening. The top portion of the via opening will have a dimension that equals to the aperture dimension 248b of the metal shoulder 126. The size of metal shoulder to be grown is determined by the preferred aperture dimension. In one embodiment of the device, the preferred width of the metal shoulder 126 ranges from 1 to 10 nm to form an aperture dimension that is no greater than a width of the metal line 120 in the first metallization layer 110. The material used to form the metal shoulder 126 includes cobalt (Co), tungsten (W), ruthenium (Ru) or other metals that can be selectively deposited on the seeding material 124.

Figure 2H:
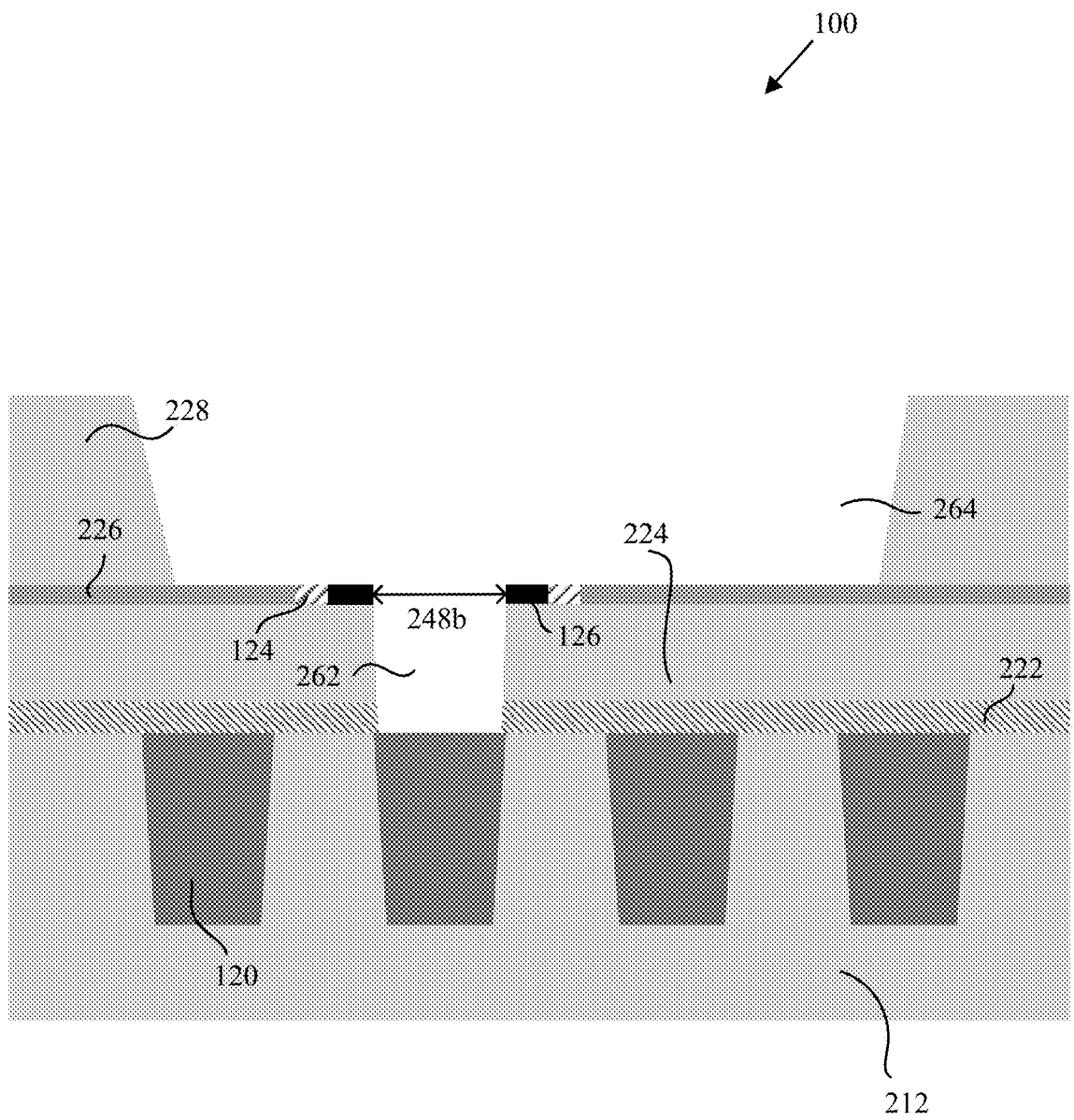

FIG. 2H illustrates the semiconductor device 100 after forming a via opening 262. Using an anisotropic etch process, the via opening 262 is formed in the second dielectric layer 222 and the third dielectric layer 224, with the aperture dimension 248b defined by the grown metal shoulder 126. The via opening 262 has a bottom opening defined by an opening in the second dielectric layer 222, aligned to the metal line 120, and has a dimension less than a width of the metal line 120. The second hardmask layer and the remaining portions of the fourth dielectric layer in the trench are removed, forming a trench line 264. The first hardmask layer 226 acts as an etch stop layer that prevents over-etching into the third dielectric layer 224. The process of forming the via opening 262 and the trench line 264 may be a one, a two or a multi-step process. The trench line 264 formed is perpendicular to the metal line 120.

Figure 2I:
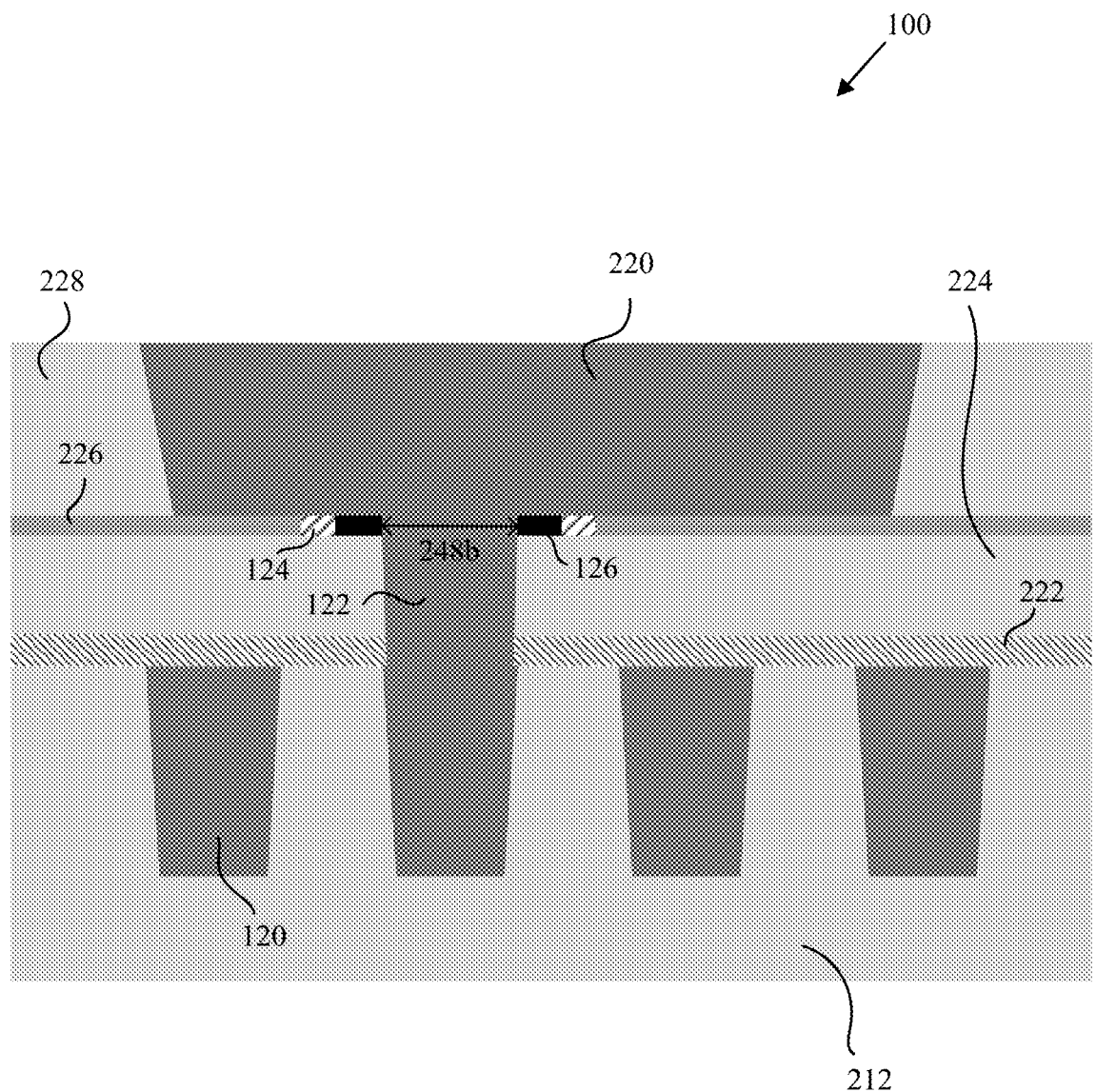

FIG. 2I illustrates the semiconductor device 100 after a second level metallization process. The via opening 262 may be filled with the same conductive material as the metal line 120, forming an interconnect via 122. The trench line 264 may also be filled with the same conductive material, forming the metal line 220 in the second metallization layer 210. The first metallization layer 110 and the second metallization layer 210 are electrically connected by the interconnect via 122. In one embodiment of the device, the conductive material is copper (Cu) and the metallization process can be performed by PVD, CVD, electrochemical deposition or electroless deposition. In another embodiment, different conductive materials may be used to form the interconnect via 122 or the trench line 264.

As presented in the above detailed description, a metal shoulder is selectively grown on a seeding material and it provides a controllable aperture dimension for the interconnect via fabrication between metallization layers. A highly controlled atomic level deposition process is used to grow the metal shoulder to a precisely specified thickness. The aperture dimension of the via opening can then be precisely controlled by the width of the metal shoulder that is grown and this method can be used in different technology nodes in semiconductor device fabrication.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device having an interconnect structure comprising:
    a metallization layer having at least one metal line;
    a dielectric layer on the at least one metal line;
    a metal ring on the dielectric layer having an outer ring portion formed of a first metal and an inner ring portion formed of a second metal; and
    a via opening formed in the dielectric layer, wherein the metal ring is located at a shoulder portion of the via opening and the metal ring has an aperture dimension that equals a top opening dimension of the via opening.

2. The device of claim 1, wherein the via opening has a bottom opening having a dimension that is smaller than a width of the at least one metal line.

3. The device of claim 1, wherein the first metal of the outer ring portion comprises titanium nitride.

4. The device of claim 1, wherein the outer ring portion of the metal ring comprises a width ranging from 2 to 20 nm.

5. The device of claim 1, wherein the second metal of the inner ring portion comprises cobalt, tungsten or ruthenium.

6. The device of claim 1, wherein the inner ring portion of the metal ring comprises an aperture dimension that is no greater than a width of the at least one metal line.

7. The device of claim 1, wherein the inner ring portion of the metal ring comprises a width ranging from 1 nm to 10 nm.

8. The device of claim 1, further comprises a capping layer over the at least one metal line, wherein the capping layer has an opening that defines a bottom opening of the via opening.

9. The device of claim 1, further comprises a hardmask layer over the dielectric layer, wherein the hardmask layer is arranged adjacent to the metal ring.

10. The device of claim 9, wherein the hardmask layer comprises aluminum oxide.

11. A semiconductor device having an interconnect structure comprising:
    a first metal line;
    an interconnect via over the first metal line;
    a metal ring having an outer ring portion formed of a first metal and an inner ring portion formed of a second metal located at a shoulder portion of the interconnect via, wherein the metal ring has an aperture dimension that equals a top opening of the interconnect via; and
    a second metal line over the interconnect via, wherein the interconnect via electrically connects the first metal line and the second metal line.

12. The device of claim 11, wherein the first metal line is arranged perpendicular to the second metal line.

13. The device of claim 11, wherein the first metal line, the second metal line and the interconnect via comprise a same conductive material.

14. The device of claim 13, wherein the conductive material comprises copper.

* * * * *